United States Patent [19]

Kane

[11] Patent Number: 4,741,004
[45] Date of Patent: Apr. 26, 1988

[54] HIGH-SPEED PROGRAMMABLE DIVIDE-BY-N COUNTER

[75] Inventor: Michael G. Kane, Rocky Hill, N.J.

[73] Assignee: Microwave Semiconductor Corporation, Somerset, N.J.

[21] Appl. No.: 913,048

[22] Filed: Sep. 29, 1986

[51] Int. Cl.⁴ .......................................... H03K 23/66
[52] U.S. Cl. .................................... 377/110; 377/52; 377/111
[58] Field of Search .......................... 377/52, 110, 111

[56] References Cited

U.S. PATENT DOCUMENTS

| 3,391,305 | 7/1968 | Bradwin et al. | 377/110 |
|---|---|---|---|
| 3,493,872 | 2/1970 | Sepe | 377/110 |
| 3,774,056 | 11/1973 | Sample | 377/110 |
| 4,002,926 | 1/1977 | Moyer | 377/47 |
| 4,181,862 | 1/1980 | Dingwall | 377/117 |
| 4,214,173 | 7/1980 | Popper | 377/117 |
| 4,234,849 | 11/1980 | Crilly, Jr. | 377/110 |
| 4,264,864 | 4/1981 | Takeda | 377/110 |
| 4,310,801 | 1/1982 | Baker | 377/110 |
| 4,331,926 | 5/1982 | Minakuchi | 377/110 |
| 4,509,182 | 4/1985 | Minakuchi | 377/116 |

FOREIGN PATENT DOCUMENTS 2016983 12/1976 Fed. Rep. of Germany .
2656605 6/1978 Fed. Rep. of Germany .
1336258 11/1973 United Kingdom .

OTHER PUBLICATIONS

Article from IEEE Journal of Solid–State Circuits, vol. SC-20, No. 6, Dec. '85, by Rocchi et al., pp. 1194 to 1199.

Primary Examiner—John S. Heyman
Attorney, Agent, or Firm—John F. Moran

[57] ABSTRACT

A programmable divide-by-N counter employs a plurality of speed enhancement techniques to provide an overall operational speed corresponding to the speed at which a single-clocked flip-flop is capable of being toggled. The counter configuration provides flexibility in selecting the value of N, the programmable divisor, as well as the possibility of increasing the length the counting chain without producing a reduction in overall operational speed. The speed enhancement techniques are primarily located in the reset logic portion of the counter. A key aspect utilized through-out the overall circuit is that critical signal propagation paths in terms of speed of operation present no more than four gate delay intervals in total response time.

11 Claims, 5 Drawing Sheets

FIG. 6

| COUNT | F-F STATES |||||| |
|---|---|---|---|---|---|---|
| | $Q_1$ | $Q_2$ | $Q_3$ | $Q_4$ | $Q_5$ | $Q_6$ |
| 58 | 0 | 1 | 0 | 1 | 1 | 1 |
| 59 | 1 | 1 | 0 | 1 | 1 | 1 |
| 60 | 0 | 0 | 1 | 1 | 1 | 1 |
| 61 | 1 | 0 | 1 | 1 | 1 | 1 |
| 62 | 0 | 1 | 1 | 1 | 1 | 1 |
| 63 | 1 | 1 | 1 | 1 | 1 | 1 |
| (63-N) | — | — | — | — | — | — |
| (63-N)+1 | — | — | — | — | — | — |

⦉ = A NEGATIVE-GOING CLOCK EDGE

FIG. 8

| CLOCK EDGE NO. | $Q_1$ | $Q_2$ | $Q_3$ | $Q_4$ | $Q_5$ | $Q_6$ | COMMENTS |
|---|---|---|---|---|---|---|---|
| 56 | 1/2τ/0 | 1/2τ/0 | 1/2τ/0 | 0/3τ/1 | 1 | 1 | — (PART ONE BEGINS) |
| 57 | | | | | 1 | 1 | |
| 58 | 1 | 0 | 0 | 1 | 1 | 1 | |
| 59 | | | | | | | |
| 60 | 0 | 1 | 0 | 1 | 1 | 1 | |
| 61 | 1/2τ/0 | 1/2τ/0 | 0/3τ/1 | 1 | 1 | 1 | |
| 62 | 3τ/1 | 0 | 1 | 1 | 1 | 1 | — END OF COUNT<br>— (PART ONE ENDS; PART TWO BEGINS) |
| 63 | 0 | 1 | 1 | 1 | 1 | 1 | — RESET PULSES GENERATED; 011111 STATE IS NEVER FULLY REACHED. |
| (63-N) | ( | | 63-N | | | ) | |
| (63-N)+1 | ( | | 63-N+1 | | | ) | — RESET PULSES EXTINGUISHED. (PART TWO ENDS) |

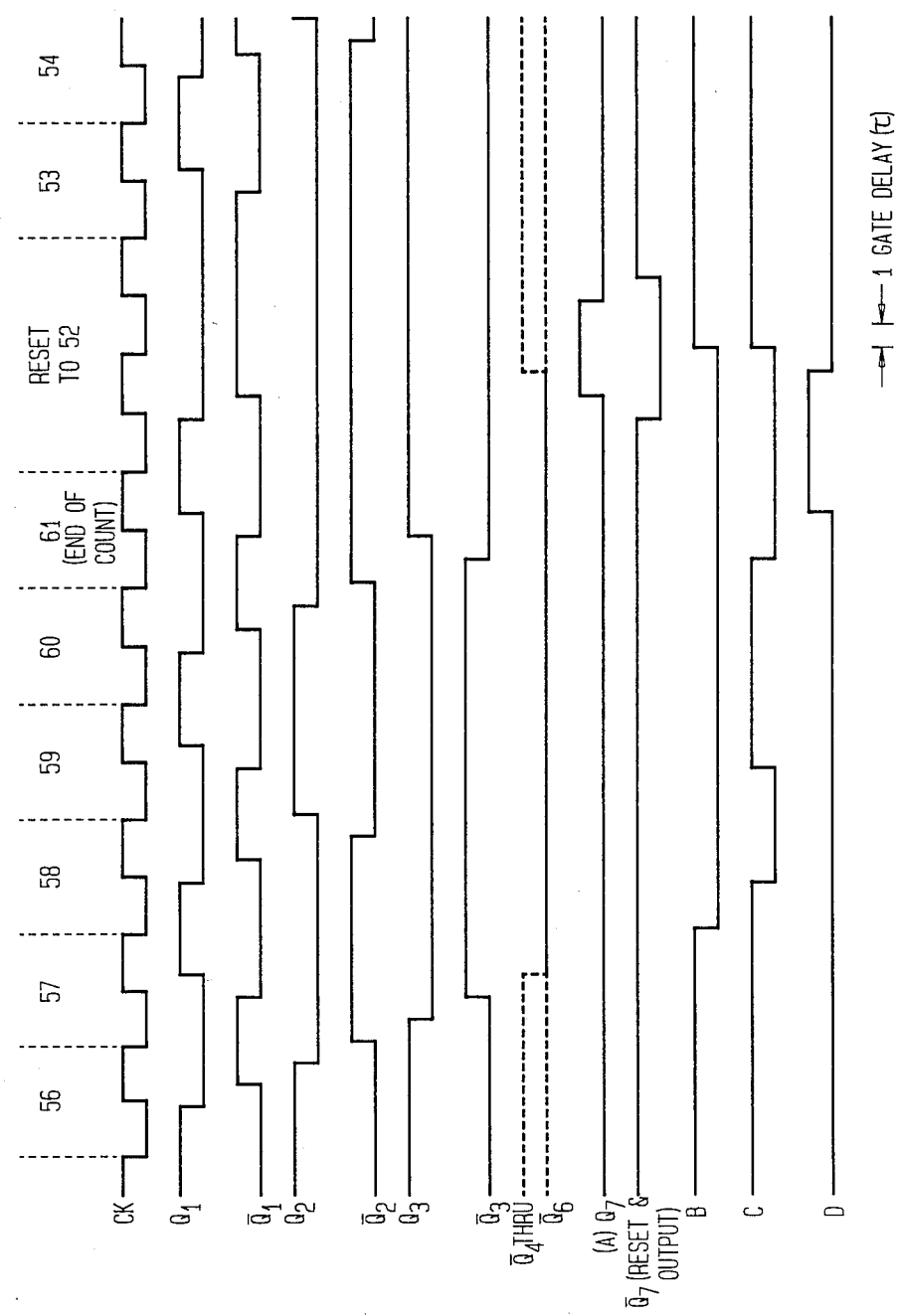

HIGH-SPEED PROGRAMMABLE DIVIDE-BY-N COUNTER

BACKGROUND OF THE INVENTION

The present invention relates to a programmable divide-by-N counter where the value of N may be even or odd and increased by adding stages without decreasing the speed of operation. The invention, more particularly, relates to a programmable dividing counter employing speed enhancement techniques primarily within its reset logic portion.

Divide-by-N programmable counters, also known as programmable frequency dividers, of various conventional configurations have been used to advantage in numerous applications through out the art of digital circuitry. Many of these programmed counters or frequency dividers employ specific features to provide specialized functions peculiar to their applications. One of the more commonly desired characteristics sought is high speed operation.

High-speed phase-locked loops (PLLs) affording high-frequency resolution and short lock-up time are considered to be the basic element of the frequency synthesizer tuning systems required for radio links or mobile radio according to an article entitled "A 1.2-GHz Frequency Synthesizer Using A Custom-Design Divide-by-20/21/22/23/24 GaAs Circuit" of the IEEE Journal of Solid-State Circuits, Vol. SC-20, No. 6, December 1985 by Rocchi et al. In order to meet these objectives with conventional techniques, the division ratio in the PLL must be as low as possible which implies the use of high-speed frequency dividers. Furthermore, the use of a variable prescaler instead of a fixed frequency divider in prior art circuits enhances the frequency resolution, and the reference frequency can be increased to improve the loop noise performance.

There are also various other desirable characteristics for the foregoing applications and other applications involving the implementation of programmable dividing counters. Flexibility in changing the value of N enables such a counter to be used in a greater number and different applications. Other considerations are ease of fabrication and adaptability to variously used integrated circuitry technologies. Also, the utilization of a minimal amount of circuitry to provide the requisite operational features is advantageous in terms of both reliability and cost.

Although static binary ripple counters have been used extensively, straight forward designs employing programmable divisors are subject to a significant operational speed limitation. Typically in such arrangements during the course of normal operation, it is required that the duration of the period of a clock cycle be at least equal to the propagation delay experienced by the signal in traversing six gates serially connected together or the equivalent circuitry. Thus, the maximum operating frequency is limited to one over $6\tau(1/6\tau)$ or less, where $\tau$ is the average loaded gate delay time and one clock period is $6\tau$. Since individual single-clocked flip-flops are capable of toggling at a frequency of one over four $\tau$ ($\frac{1}{4}\tau$), the operating frequency of ripple counters generally comprising serially connected flip-flops is reduced by one-third in order to provide a programmable divide-by-N function.

SUMMARY OF THE INVENTION

It is an object of the present invention to provide a plurality of serially connected stages in the form of a counter wherein the speed of overall operation is essentially the same as the speed of operation of a single stage, or a flip-flop, while providing versatile divide-by-N control of its operation.

Another object of the invention is to provide a high-speed binary ripple counter wherein all critical timing paths provide a cumulative propagation delay of no more than four gate delay intervals.

A related object of the invention is to provide a programmable divide-by-N counter wherein speed enhancement techniques are utilized within its reset logic portion.

A further object of this invention is to provide a fast operating circuit configuration which may be fabricated using any of the well established integrated circuit technology processes.

An illustrative embodiment of the invention takes the form of a binary ripple static counter employing reset logic divided into two serial logic paths to provide a pipelined input and output interfacing circuitry for a reset flip-flop configured to provide fast response. On the input side of the reset flip-flop, an end-of-count detector detects a predetermined state occurring before the final state of the ripple counter. In addition, the reset flip-flop is also configured to provide self-suppressing operation for producing reset pulses of short duration corresponding to the period of a single clock cycle.

In some of the further aspects of the invention, the recovery time corresponding to a gate delay interval after the termination of a SET or RESET signal input is compensated by speeding up the response to those two inputs by employing AND-OR-INVERT (AOI) gates for combining the signal indicative of the least significant digit of the count value or state of the counter and the reset pulse of the end-of-count detector. The end-of-count detector employs a logic configuration for producing a first intermediate logic signal indicative of the same concurrent state for the second half of the counting chain indicative of the more significant bits of the final state count. This first intermediate logic signal is logically combined with the lesser significant bits of the final state count to reduce the output response time of the end-of-count detector. The leading or first binary stage of the counting chain utilizes reset enabling logic for earlier removal of the set and reset signals. The reset flip-flop also includes a feedback loop for promptly self-suppressing the reset pulse. In addition, various other techniques are employed to decrease the overall response time of the counter. A feature of this counter is that all critical timing paths present no more than four gate delay intervals to the progagating signal transitions traversing them.

BRIEF DESCRIPTION OF THE DRAWING

Additional features of the invention and additional objects of the invention will be more readily appreciated and better understood by reference to the following detailed description which should be considered in conjunction with the drawing.

FIG. 6 is a sequential state diagram for depicting circuit operation prior and during the transition between counting cycles.

FIG. 7 is another timing waveform diagram representing operation when the value of N is odd.

FIG. 8 is a sequential state diagram serving to demonstrate the relative timing relationship between various state transitions in the counter of FIG. 1.

DETAILED DESCRIPTION

Figure 1:
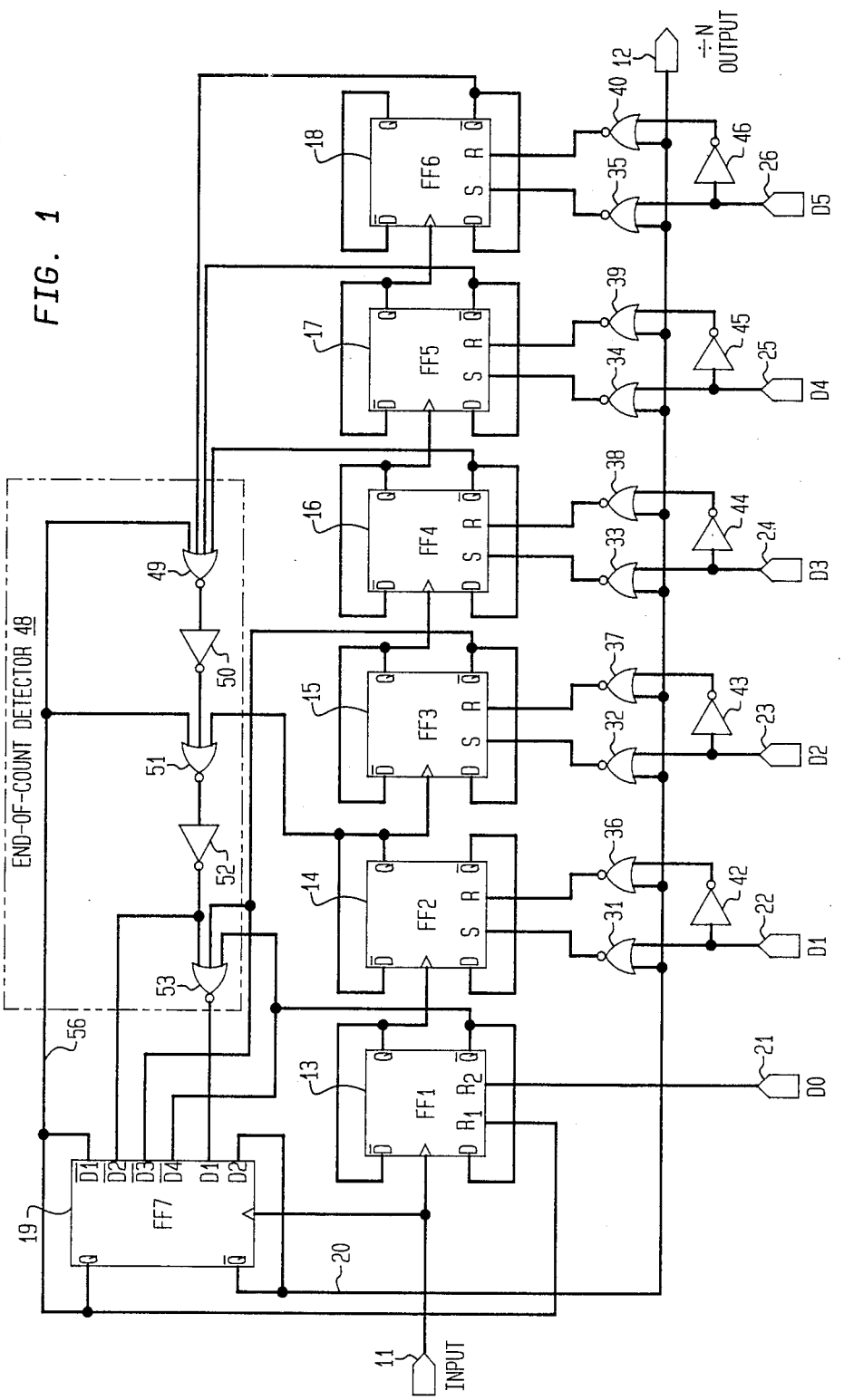
FIG. 1 is an overall diagram of a binary ripple counter in accordance with the invention partially known in block diagram form and partially shown in schematic form.

In the circuit of FIG. 1, a six stage binary ripple counter is connected to receive a binary input signal via input terminal 11 and to provide a divide-by-N output at output terminal 12. Since the counter of FIG. 1 includes six stages, the maximum value of N, the divisor, is sixty-three (i.e. $2^6 - 1$). However, as is well known to those in the art, the maximum divisor may be readily increased simply by adding stages to the ripple counter. In this case due to the inventive principles utilized, the addition of stages will not result in a significant effect on the operating speed of the counter. It should be pointed out at the outset that the maximum counter frequency of the circuit of FIG. 1 is the same as that which can be obtained by an individual self-toggling flip-flop.

The counter of FIG. 1 counts upward in the direction of the 111111 state. Since the logic of the circuit of FIG. 1 is in a counting chain configuration, each flip-flop of flip-flops 13–18, or FF1 through FF6, provides a Q and $\overline{Q}$ output corresponding to one-half its input signal frequency which is applied to its clock input. Thus only leading flip-flop 13 operates at the frequency of the signal applied to the input terminal 11. As the counter is incremented upward and reaches the 101111 state wherein the least significant bit is the first bit, a reset pulse is generated by reset flip-flop 19 on its $\overline{Q}$ output on reset line 20 which is connected to output terminal 12. This reset signal goes low to provide an indication for an end-of-count state.

The operation of flip-flops 13–18 is known to those skilled in the digital logic art as complementary D-type flip-flop operation. The falling edge of the clock pulse triggers the flip-flop to assume the state present at the data inputs. Two complementary data inputs (i.e., D and $\overline{D}$) are used to increase response time and to provide an increase in the noise immunity of the circuit. The SET and RESET inputs override the other inputs to force the flip-flop to assume their indicated state. When the internal circuitry of the flip-flops is discussed, it will become evident that flip-flip 13 is modified compared to the other flip-flops to provide faster counter operation.

The reset pulse on reset line 20 enables NOR gates 31–35 to allow the signal values of D1 through D5 to appear at the RESET (R) inputs of flip-flops 14–18. At the same time, inverted signal values of D1 through D5 via inverters 42–46 are applied to the SET (S) inputs of flip-flops 13–18. This forces the counter into a predetermined binary state. In this case, the predetermined binary state is the complement of the programmed divisor N which actually is 63-N. The value of N is a six digit binary number applied to terminals 21–26, or D0 through D5, for programming the counter of FIG. 1. When the reset pulse of reset flip-flop 19 ($\overline{Q}$ output) ends, the ripple counter begins counting toward the 111111 state again. The 101111 state is detected rather than the final count state of 111111 to provide additional time for the circuit to enter into and exit from the reset cycle. This state is two counts earlier than the final state count. Since reset flip-flop 19 is triggered from input 11, the overall count between reset pulses is therefore the exact value of N. As is apparent from the circuit of FIG. 1, the reset pulse (the $\overline{Q}$ output of reset flip-flop 19) also serves as a low going signal to provide the divided-by-N output at output terminal 12. A positive going pulse may be obtained for the output from the Q output of reset flip-flop 19.

In conventional versions of the circuit of FIG. 1, a divided-by-N programmable counter will typically require a clock cycle having a duration of at least six gate delays primarily due to the requirement of providing sufficient time for the time consuming reset cycle operation. Therefore, the maximum operating frequency corresponds to one over six $\tau$ or less, where $\tau$ is the average loaded gate delay. Since individual singly clocked flip-flops are generally capable of toggling at a frequency of one over four $\tau$, the operating frequency of conventional ripple counters is reduced by 33% in order to accomodate the programmable versatility of a divided-by-N counter.

In accordance with the inventive principles, a plurality of speed enhancement features are employed in the reset logic portion of the circuit of FIG. 1. Since the reset logic is the critical timing path, the utilization of these features enables the counting circuit of FIG. 1 to operate at a maximum counting frequency corresponding to that of an individual self-toggling flip-flop in spite of the introduction of the programmable divide-by-N function. A key aspect of the circuit configuration, in the interest of fast response, is to subject all time critical circuit operations to no greater than four gate delay intervals.

End-of-count detector 48 comprises NOR gate 49, inverter 50, NOR gate 51, inverter 52, and NOR gate 53. In addition to the pulse provided at the Q output of reset flip-flop 19, the other inputs to NOR gate 49 of detector 48 are provided by the $\overline{Q}$ outputs of flip-flops 16-18. The output of NOR gate 49 switches to a low level five counts before the end-of-count state in preparation for operating NOR gate 51 via inverter 50. Four counts later, in response to the rippling input signal, the Q output of flip-flop 14 switches to a low level followed by the $\overline{Q}$ output of flip-flop 15 switching to a low level. As a result, the changed output of NOR gate 51 is applied via inverter 52 to NOR gate 53. Next in response to the input signal, $\overline{Q}$ of flip-flop 13 switches to a zero state which is applied to the $\overline{D4}$ input of reset flip-flop 19 and one input of NOR gate 53. Since the $\overline{Q}$ output from flip-flop 15 applied to the remaining input of NOR gate 53 already changed to the low state, NOR gate 53 produces a high output signal that is applied to the D1 input of reset flip-flop 19 to indicate the end-of-count.

Upon the occurrence of the next falling transition from input terminal 11 to reset flip-flop 19, the Q output of reset flip-flop 19 goes high while the $\overline{Q}$ output of the reset flip-flop goes low. If a high level is present on D0 input 21, the Q output from flip-flop 19 resets leading flip-flop 13. The $\overline{Q}$ output from flip-flop 19 enables NOR gates 31–40. Then, the D1–D6 values in accordance with N are allowed to reset all remaining stages of flip-flops 14–18 to an initial start-of-count value.

Reset flip-flop 19 as previously mentioned produces a positive going reset pulse at its Q output. Via line 56, the positive reset pulse forces end-of-count detector 48 back into its resting state for detecting the occurrence of the next 101111 state of the counting chain comprising flip-flops 13–18. As is evident in FIG. 1, the positive-going reset pulse from the Q output is applied to the $\overline{D1}$ input of reset flip-flop 19 and the negative-going reset pulse from the $\overline{Q}$ output is applied to the D2 input. As a result, reset flip-flop 19 toggles itself off and extinguishes the reset pulse one clock cycle after it began. Therefore, reset flip-flop 19 is provided with a self-suppressing feature. This feature relieves the ripple counting chain of responsibility for resetting end-of-count detector 48 as well as reset flip-flop 19. Accordingly, due to this feature the reset cycle is speeded up.

Figure 2:
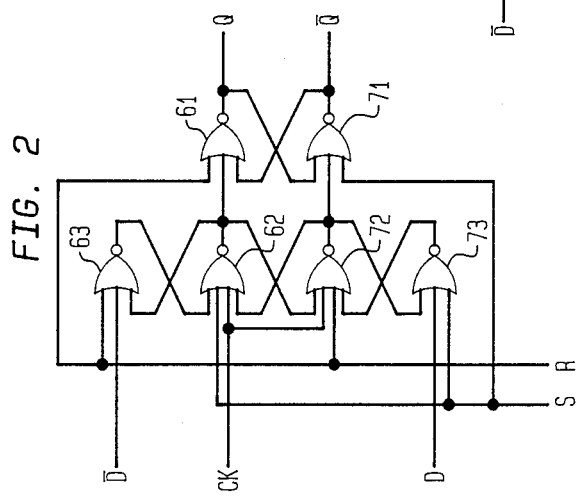
FIG. 2 is a gate level flip-flop diagram suitable for all but the leading flip-flop used in the ripple counting chain of the counter FIG. 1.

FIG. 2 provides a suitable internal circuit for each of flip-flops 14–18. As is evident from the circuit of FIG. 2, the circuit is highly symmetrical due to its complementary signaling configuration. In other words, NOR gates 61–63 are the complement of NOR gates 71–73. From an operational standpoint, while NOR gates 61–63 respond to the R and $\overline{D}$ inputs to provide the Q output, NOR gates 71–73 respond to the S and D inputs to provide the $\overline{Q}$ output. In response to the falling edge of the clock signal applied to both NOR gates 62 and 72, the state of the D input appears at the Q output.

Figure 3:
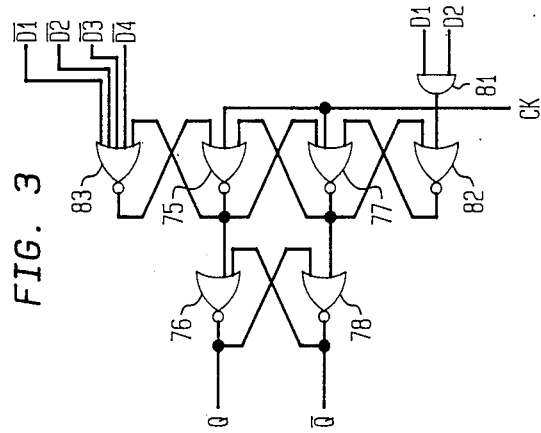
FIG. 3 is a gate level diagram particularly suited for the reset flip-flop utilized in the counter of FIG. 1.

FIG. 3 is the internal diagram for reset flip-flop 19 of FIG. 1. Although the innermost portion of the circuit comprising NOR gates 75 and 76 is symmetrical with respect to NOR gates 77 and 78, the outer circuitry portions responsive to the D and $\overline{D}$ signals are different. In one outer portion D1 and D2 are logically ANDed in AND gate 81 to provide one input to NOR gate 82. In the other outer portion, $\overline{D1}$, $\overline{D2}$, $\overline{D3}$ and $\overline{D4}$ are logically ORed together in NOR gate 83 which is cross coupled to NOR gate 75. In response to the falling transition of the clock signal, NOR gates 75 and 77 assume complementary states in accordance with the $\overline{D1}$ through $\overline{D4}$ inputs and the D1 and D2 inputs to provide the positive going reset pulse from the Q output and the negative going pulse from the $\overline{Q}$ output.

Figure 4:
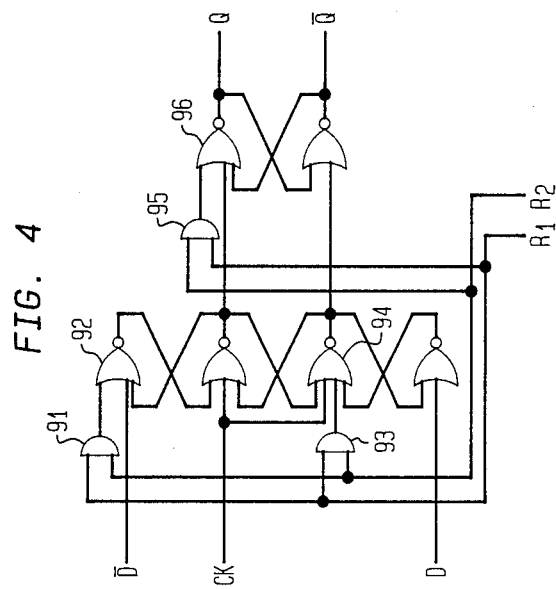
FIG. 4 provides a suitable internal circuit, also at the gate level, for providing the desired fast response and high speed operation for the leading flip-flop situated at the beginning of the ripple counting chain of the counter of FIG. 1.

In the interest of speed, leading flip-flop 13 is provided with a different internal circuit according to FIG. 4. This is due to the fact that flip-flop 13 as the leading flip-flop in the ripple counting chain must toggle earlier than the remaining or following flip-flops 14–18. Since a flip-flop cannot be successfully clocked for at least one gate delay interval after a SET or RESET input signal is removed from its input, this operational delay is known as the "recovery time". To compensate for the recovery time of flip-flop 13, the RESET signal is sped up by combining to D0 input and the positive going reset pulse from reset flip-flop 19 within the internal circuit of FIG. 4. Specifically, gate combinations of AND gate 91 and NOR gate 92, AND gate 93 and NOR gate 94, and AND gate 95 and NOR gate 96 serve as AND-OR-INVERT (AOI) gates. This configuration provides a rapid reset operation with minimal delay because the enabling operation (preformed for flip-flops 14–18 by NOR gates 31–40) is performed with no extra gate delay by AOI gates 91, 92; 93, 94; and 95, 96.

No SET input is required for flip-flop 13, since the flip-flop will automatically return to the "one" state at the beginning of a new counting cycle if it is allowed to run free. This corresponds to division by an even value of N. That is, flip-flop 13 simply operates as a divide-by-two prescaler. For division by an odd value of N, a reset signal is generated within the AOI gates in flip-flop 13.

Both experience and analysis indicate that the divide-by-N counter of FIG. 1 requires only four gate delays per clock cycle for correct counting. Since the flip-flop circuit herein disclosed has a maximum toggling frequency of one over four $\tau$, this is the fastest operation possible given the flip-flop configurations being used. In a six stage ripple counter, correct division for values of N=3 to 63 occurred for frequencies right up to exactly $\frac{1}{4}\tau$.

Figure 5:
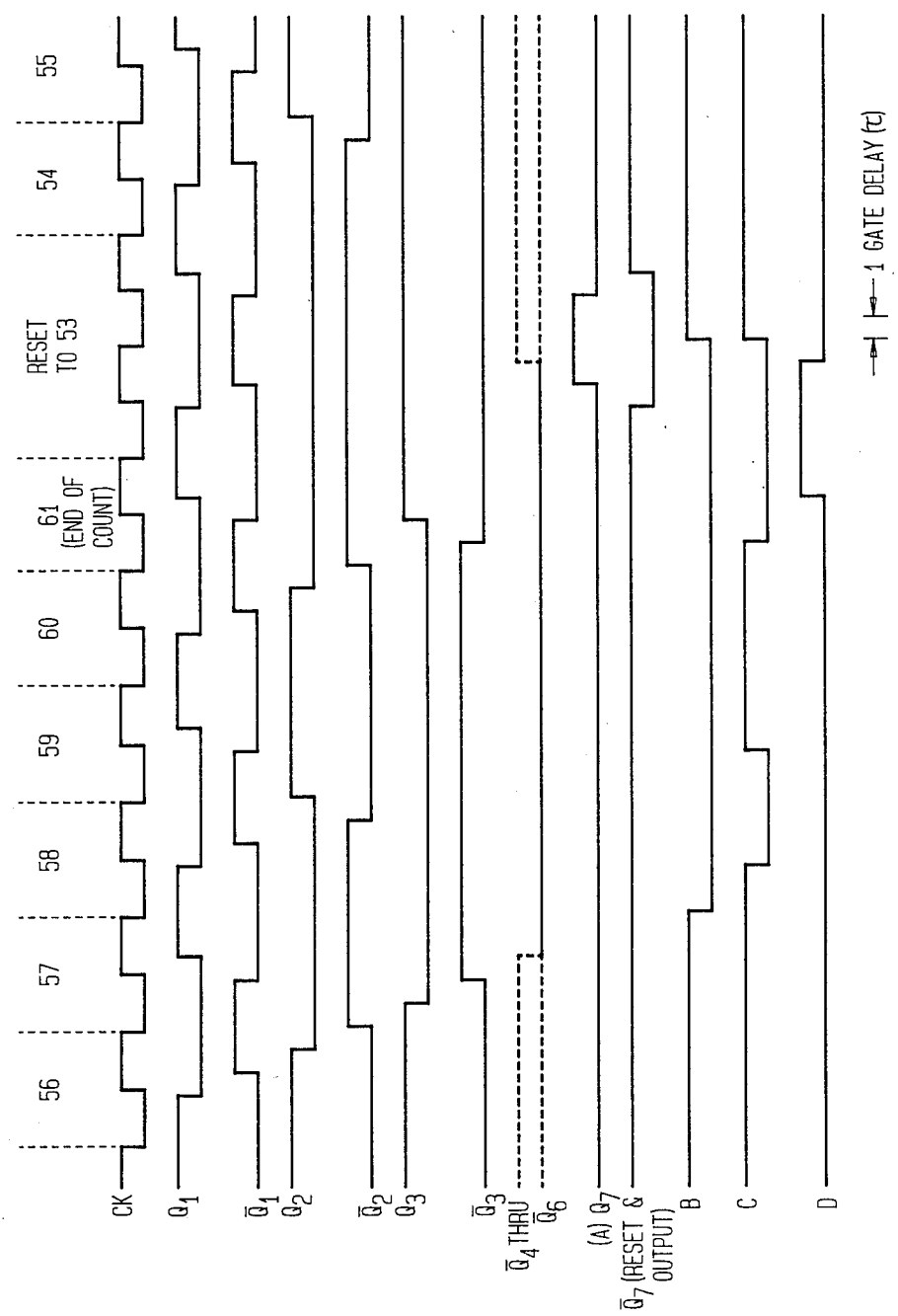
FIG. 5 is a timing waveform diagram for illustrating operation of the circuit of FIG. 1 when the value of N is even.

FIG. 5 is a timing diagram indicating various signal levels produced in response to a clock signal input as the counter of FIG. 1 progresses through a sequence of counting states. The clock signal applied to the counter provides the rectangular waveform appearing at the top of FIG. 5 while the counter of FIG. 1 is reset to state fifty three and up-counts to state sixty-one. In this case, a divide-by-ten operation is performed wherein the digital value of N the programmable divisor applied to the D0 D1 D2 D3 D4 D5 inputs is in the form of 101011 which is the complement of binary ten (010100). Flip-flop 13 is toggled by the clock signal and produces the Q1 and $\overline{Q1}$ outputs shown in FIG. 5. Since flip-flop 13 is in the leading position, it operates or toggles at the highest rate in relation to the succeeding flip-flops in the counting chain. At the bottom of FIG. 5, the duration of one gate delay is indicated and this interval corresponds to one-fifth of the duration of the period of the clock cycle.

Below the output of flip-flop 13, the Q2 and $\overline{Q2}$ outputs are depicted for flip-flop 14. Next in the counting chain is flip-flop 15 which produces the Q3 and $\overline{Q3}$ signals.

The next signal line in FIG. 5 represents a composite of the complementary outputs ($\overline{Q4}$, $\overline{Q5}$, $\overline{Q6}$) of flip-flops 16, 17 and 18. The dotted portion indicates that these signal values may be at the one or zero level while the solid portion shows the time when all three complementary outputs maintain a zero-level. Reset flip-flop 19 produces a positive going pulse signal (Q7) applied to end-of-count detector 48 and to leading flip-flop 13, and it produces a negative pulse signal ($\overline{Q7}$) for resetting the other five counting stages and providing the circuit output indicative of division by N in time relation to the clock input. The $\overline{Q7}$ pulse signal is also designated as waveform A in FIG. 5. The final three signal waveforms B, C and D respectively represent the output of inverter 50, the output of inverter 52, and the output of NOR gate 53.

FIG. 6 represents a state sequence for the counter of FIG. 1 as the reset cycle is approached and passed through. The left hand column shows the counting state while the right hand column depicts the flip-flop states in actual binary form. The arrows indicate the occurrence of transitions from one state to the next obtained state. These transitions occur during negative-going edges of the clock signal. Counting occurs in normal fashion until the sixty first state. The sixty first state is detected by end-of-count detector 48. The next state "sixty two" in only obtained instantaneously and probably not completely due to the propagation delay associated with the rippling action in the counting chain. State sixty-three is actually skipped over as the resetting operation begins next. From the reset point (63-N), the up count progresses to the next reset operation.

FIG. 7 depicts circuit operation for an odd value of N. Specifically N has a value of eleven or 001011 in complementary binary notation applied to the D0-D5 inputs of NOR gate 31-40. Therefore, the reset or starting point of the count is different. However, the operation of the circuit FIG. 1 progresses through the states in the same manner.

Following is a detailed operational analysis of the divide-by-N counter operating at its highest frequency of operation, $\frac{1}{4}\tau$. The critical timing intervals appear immediately before and after the reset pulses (positive- and negative-going) are generated. Therefore this is the period that will be described. This period may be divided into two parts: Part One, during which the data inputs of flip-flop 19 are set up; and Par Two, during which the reset pulses are generated by flip-flop 19, and flip-flops 13-18 are "jammed" with a binary input. It is the "pipelined reset path" feature of this counter that allows the reset path to be divided into two sections in this way. Breaking up the reset path is a key feature for achieving operation at a frequency of $\frac{1}{4}\tau$.

A crucial fact in the analysis that follows is that the outputs of the 6-NOR flip-flops 13-18 used in this counter deliver a high-to-low transition $2\tau$ after the clock edge. However, a low-to-high transition is delivered $3\tau$ after the clock edge. Thus the low state is delivered one gate delay $\tau$ faster than the high state. This output skew is a generic characteristic of $\frac{1}{4}\tau$ flip-flops; it is not related to the particular circuit being described here. However, the fact that low data issues from the flip-flops faster than high data means that in general it is faster to detect a flip-flop's low state than it is to detect its high state. Therefore it is important that the end-of-count detector 48 be used to detect low states in the counter flip-flops 13-18. Similarly, it is also important that each flip-flop in the counter respond to the falling edge rather than the rising edge from the preceding flip-flop in order to minimize ripple time through the counter.

In both parts of the reset period, clock edges will be numbered by the following convention: clock edge no. M is the falling clock edge that starts the counter's transition to the binary count corresponding to the number M. For example, clock, edge no. 58 starts the counter's transition to the 0101111 state (least significant bit first).

FIG. 8 should be referred to for the description that follows.

In part one, upon the occurrence of clock edge no. 56 the counter begins to ripple into the 000111 state. This takes place as follows:
Clock edge no. 56 occurs.
  $2\tau$ later Q1 changes from high to low.
  $2\tau$ later Q2 changes from high to low.
    (when the counter is operating at $\frac{1}{4}\tau$, clock edge no. 57 occurs at this same time)
  $2\tau$ later Q3 changes from high to low.
  $2\tau$ later $\overline{Q4}$ changes from high to low.
    (when the counter is operating at $\frac{1}{4}\tau$, clock edge no. 58 occurs at this same time)
  $\tau$ later/output of NOR gate 49 changes from low to high ($\overline{Q5}$ and $\overline{Q6}$ were already low from previous counting, or from the last reset cycle)
  $\tau$ later the output of inverter 50 changes from high to low.

Thus the output of inverter 50 reaches the low state $2\tau$ after clock edge no. 58 when the counter is operating at its maximum frequency, $\frac{1}{4}\tau$.

With clock edge no. 60 the counter begins to ripple into the 001111 state. This takes place as follows:
Clock edge no. 60 occurs.
  $2\tau$ later Q1 changes from high to low.
  $2\tau$ later Q2 changes from high to low. (when the counter is operating at $\frac{1}{4}\tau$, clock edge no. 61 occurs at the same time)
  $2\tau$ later $\overline{Q3}$ changes from high to low.

The transition of Q2 from high to low results in the output of NOR gate 51 changing from low to high after $\tau$, and the output of the inverter 52 changing from low to high after an additional $\tau$. Thus the output of inverter 52 reaches the low state $6\tau$ after clock eege no. 60 occurs. If the counter is operating at $\frac{1}{4}\tau$ this corresponds to $2\tau$ after clock edge no. 61 occurs. At the same time $\overline{Q3}$ changes from high to low as shown in the foregoing.

With clock edge no. 61 the counter begins to ripple into the 101111 state. This takes place as follows:
Clock edge no. 61 occurs.
  $2\tau$ later $\overline{Q1}$ changes from high to low.

At the same time $\overline{Q3}$ and the output of inverter 52 changes from high to low, as shown above. Thus $2\tau$ after clock edge no. 61 all three inputs to NOR gate 53 change from high to low. As a result, the output of NOR gate 53 changes from low to high $3\tau$ after clock edge no. 61.

Flip-flop 19 has a set-up time of $\tau$, as this is the delay necessary for data to propogate through NOR gate 83 and AND-OR-INVERT (AOI) gate 81, 82. (Only one gate delay $\tau$ is required for a signal to propagate through an AOI gate). In considering the data inputs of flip-flop 19, it may be observed that $3\tau$ clock edge no. 61 D1 and D2 are both high, and $\overline{D1}$-$\overline{D4}$ are all low. Thus the set-up condition is fulfilled for flip-flop 19 to toggle to the high state on clock edge no. 62. It is the "optimized and compacted end-of-count detector" in this counter that allows the end-of-count information to be set up at the inputs of flip-flop 19 only $3\tau$ after clock edge no. 61.

In part two, the primary object of the reset cycle is to force flip-flops 13-18 into a binary state corresponding to (63-N). This binary state is simply the binary complement of the six-bit binary code loaded into D0-D5 (inputs 21-26). The flip-flops are forced into this state following clock edge no. 62, and they remain in this state during clock edge no. 63, which is the clock edge that extinguishes the reset pulses. With the next clock edge the counter begins counting upwards again, as described in part one. A secondary purpose of the reset cycle is to directly force the end-of-count detector 48 back into its resting state in which the outputs of NOR gates 49, 51, and 53 are low. These NOR gates are also indirectly forced into this resting state as flip-flops 13-18 change to their new binary state (63-N); however, this is a long delay path that needs to be paralleled by a much faster path—the path leading from the Q output of flip-flop 19 directly back to the inputs of NOR gates 49 and 51. This is one part of the "self-suppressing reset" feature of this counter. (See next paragraph for the other part.)

Flip-flop 19 generates two reset pulses, one positive-going pulse from its Q output and one negative-going pulse from its $\overline{Q}$ output. These two reset pulse are generated as follows. When flip-flop 19 toggles to the high state, this creates a high level on its Q output and a low level on its $\overline{Q}$ output. Since flip-flop 19 is a six-NOR flip-flop, Q goes high $3\tau$ after clock edge no. 62 and $\overline{Q}$ goes low $2\tau$ after this clock edge. As a result of the feedback from Q to $\overline{D1}$ and from $\overline{Q}$ to D2, flip-flop 19 toggles low on clock edge no. 63. This is the second part of the "self-suppressing reset" feature of this counter. In what follows the other connections of the $\overline{Q}$ output will be traced, then of the Q output.

For the $\overline{Q}$ output: $2\tau$ after clock edge no. 62, $\overline{Q}$ of flip-flop 19 goes low; $3\tau$ after clock edge no. 63 it returns high again. In response to this negative-going reset pulse, NOR gate 31 to 40 are enabled; this forces the SET and RESET inputs of flip-flops 14 to 18 to go high (depending on the binary input D1 to D5) $3\tau$ after clock edge no. 62. After $\overline{Q}$ returns high, OR gates 31 to 40 are disabled, removing SET and RESET inputs from flip-flops 14–18. These flip-flops require a recovery time of $\tau$ after a SET or RESET operation before they can resume counting; because of the ripple nature of the counter, more than enough time is available for recovery. To sum up, after clock edge no. 62 the complement of the binary inputs D1–D5 is loaded into flip-flops 14–18, and this binary code remains in the flip-flops after clock edge no. 63. Resumed counting begins with the first clock edge of the new counting cycle, as the counter begins counting upward from a count of (63-N).

For the Q output: $3\tau$ after clock edge no. 62, Q of flip-flop 19 goes high; $2\tau$ after clock edge no. 63 it returns low again. Thus a positive-going reset pulse is generated by this output. When Q goes high, the high state at input R1 of flip-flop 13 enables the AND gate that feeds AOI gates 91, 92; 93, 94; and 95, 96. Whether or not flip-flop 13 is reset depends on the state of its input R2, which is connected to the D0 input of the circuit (input 21). If D0 is low during the reset pulse, no reset of flip-flop 13 occurs. Therefore, this flip-flop simple continues toggling without interruption; it toggles low on clock edge no. 62, and toggles high on clock edge no. 63. However, if D0 is high during the reset pulse, flip-flop 13 is forced to the low state. $2\tau$ after clock edge no. 63 the reset pulse is removed. If the counter is operating at a clock frequency of $\frac{1}{4}\tau$, this leaves $2\tau$ before the next clock edge appears; since the recovery time of this six-NOR flip-flop is $\tau$, the counter will respond correctly to this clock edge. This is the "reset logic incorporated in FF13" feature of this counter. To sum up, if D0 is low, flip-flop 13 is high after clock edge no. 63, but if D0 is high, flip-flop 13 is low after clock edge no. 63. Thus during the reset cycle the state of D0 is inverted and loaded into flip-flop 13. Resumed counting begins with the first clock edge of the new counting cycle.

There has thus been shown and described a novel counter which fulfills all the objects and advantages sought therefor. Many changes, modifications, variations and other uses and applications of the subject invention will, however, become apparent to those skilled in the art after considering this specification and the accompanyig drawing which disclose the preferred embodiments therefore. In addition to the modifications already mentioned or alluded to in the foregoing, a down-counting configuration may be used instead of an up-counting configuration. All such changes, further modifications, variations and other uses and applications which do not depart from the spirit and scope of the invention are deemed to be covered by the invention which is limited only by the claims which follow.

What is claimed is:

1. Apparatus for dividing the frequency of applied signal by a programmable integer divisor comprising:
   a plurality of binary stages serially connected together to form a ripple counter wherein each stage has input means for receiving an initial state and a clock input and a first output, the first output of each stage being connected to the clock input of the following stage;
   resetting means comprising an end-of-count detector, a reset flip-flop having an output line, and a plurality of gates responsive to the output line by being enabled, the output of each of the plurality of gates connected to the input means of a counting stage, the plurality of gates connected to receive the programmable integer divisor for setting an initial state for the ripple counter, the end-of-count detector responsive to a predetermined state occurring before the final state of the ripple counter operating in response to the applied signal and indicating its occurrence to the reset flip-flop; and
   the reset flip-flop comprising an input responsive to the applied signal and a plurality of inputs operating in parallel responsive to the occurrence of the earlier state for enabling the plurality of gates for resetting the ripple counter to the initial state for entering a new counting cycle, the output line also serving to indicate each occurrence of resetting as the divisor output, the reset flip-flop further comprising a first plurality of NOR gates operating in parallel and connected together in cross-coupled fashion for providing two concurrent output signals, a second plurality of NOR gates also operating in parallel and connected together in cross-coupled fashion for providing two reset output signals in response to the two concurrent output signals, and one of the outermost NOR gates of the first plurality having a plurality of inputs each to an output of the end-of-count detector and the other one of the outmost NOR gates of the first plurality having one input responsive to a AND gate whose two inputs are responsive to the output state of the first bistable stage in the ripple counter.

2. Apparatus for dividing the frequency of an applied signal by a programmable integer divisor comprising:
   a plurality of binary stages serially connected together to form a ripple counter wherein each stage has input means for receiving an initial state and a clock input and a first output, the first output of each stage being connected to the clock input of the following stage;
   resetting means comprising an end-of-count detector, a reset flip-flop having an output line, and a plurality of gates responsive to the output line by being enabled, the output of each of the plurality of gates connected to the input means of a counting stage, the plurality of gates connected to receive the programmable integer divisor for setting an initial state for the ripple counter, the end-of-count detector responsive to a predetermined state occurring before the final state of the ripple counter operating in response to the applied signal and indicating its occurrence to the reset flip-flop; and
   the reset flip-flop comprising an input responsive to the applied signal and a plurality of inputs operating in parallel responsive to the occurrence of the earlier state of enabling the plurality of gates for resetting the ripple counter to the initial state for entering a new counting cycle, the output line also serving to indicate each occurrence of resetting as the divisor output, the end-of-count detector comprising a logic circuit configuration having a plurality of inputs each responsive to the output of the binary stages in the second half of the counting chains for providing a first intermediate logical signal indicative of the occurrence of the same concurrent state, a NOR gate having a first input responsive to the intermediate logical signal and a second input responsive to the output of the binary state preceding the second half of the counting chain for providing a second intermediate logical signal and another NOR gate having a first input responsive to the second intermediate logical signal and a second input responsive to the first output of the first binary stage in the counting chain.

3. Apparatus of dividing the frequency of an applied signal by a programmable integer divisor comprising:
 a plurality of binary stages serially connected together to form a ripple counter wherein each stage has input means for receiving an initial state and a clock input and a first output, the first output of each stage being connected to the clock input of the following stage;
 resetting means comprising an end-of-count detector, a reset flip-flop having an output line, and a plurality of gates responsive to the output line by being enabled, the output of each of the plurality of gates connected to the input means of a counting stage, the plurality of gates connected to receive the programmable integer divisor for setting an initial state for the ripple counter, the end-of-count detector responsive to a predetermined state occurring before the final state of the ripple counter operating in response to the applied signal and indicating its occurrence to the reset flip-flop; and
 the reset flip-flop comprising an input responsive to the applied signal and a plurality of inputs operating in parallel responsive to the occurrence of the earlier state for enabling the plurality of gates for resetting the ripple counter to the initial state for entering a new counting cycle, the output line also serving to indicate each occurrence of resetting as the divisor output, said first binary state comprising reset logic means responsive to the first reset output of said reset flip-flop and the least significant signal bit in the programmed reset value for removing set and reset signals from the first plurality of NOR gates in said first binary stage at least one gate delay interval before the next-falling edge of the applied signal.

4. Apparatus according to claim 1 wherein said reset flip-flop further comprises means for self-suppressing comprising first and second feedback means for terminating the reset pulse.

5. Apparatus according to claim 4 wherein said first feedback means comprises means for applying a first reset signal to an input logically ORed with the plurality of inputs responsive to the end-of-count detector.

6. Apparatus according to claim 4 wherein said second feedback means comprises means for applying the signal of said reset line to the AND input for controlling the state of the other one of the outer most NOR gates.

7. Apparatus according to claim 6 wherein each of the plurality of binary stages comprises a D-type flip-flop.

8. Apparatus according to claim 7 wherein each D-type flip-flop has complementary data inputs, D and $\overline{D}$, and complementary outputs, Q and $\overline{Q}$, of which the Q output serves as the first output.

9. Apparatus according to claim 8 wherein each D-type flip-flop comprises means for applying the Q output of the $\overline{D}$ input and means for applying the $\overline{Q}$ output to D input.

10. Apparatus according to claim 9 wherein the plurality of binary stages are connected to increase their count in response to the clock input.

11. Apparatus according to claim 10 wherein the plurality of binary stages comprises six serially connected stages.

* * * * *